United States Patent [19]

Mizukoshi et al.

[11] Patent Number: 4,618,879
[45] Date of Patent: Oct. 21, 1986

[54] SEMICONDUCTOR DEVICE HAVING ADJACENT BONDING WIRES EXTENDING AT DIFFERENT ANGLES

[75] Inventors: Masataka Mizukoshi, Kokubunji; Teiichi Endo, Kawasaki, both of Japan

[73] Assignee: Fujitsu Limited, Kawasaki, Japan

[21] Appl. No.: 601,360

[22] Filed: Apr. 18, 1984

[30] Foreign Application Priority Data

Apr. 20, 1983 [JP] Japan ............................. 58-070558

[51] Int. Cl.⁴ .................... H01L 23/48; H01L 23/50
[52] U.S. Cl. ...................... 357/74; 357/80; 361/401
[58] Field of Search ............... 174/52 FP; 357/65, 68, 357/74, 80; 361/401, 404, 408

[56] References Cited

U.S. PATENT DOCUMENTS 3,515,952  2/1965  Robinson ............................. 357/65
4,513,355  4/1985  Schroeder et al. .................... 357/74

FOREIGN PATENT DOCUMENTS 0061041  5/1980  Japan ................................. 357/80
0061051  5/1980  Japan ................................. 357/65
0115351  9/1980  Japan ................................. 357/74
0090748  5/1983  Japan ................................. 357/65

Primary Examiner—James W. Davie
Assistant Examiner—Vangelis Economou
Attorney, Agent, or Firm—Staas & Halsey

[57] ABSTRACT

A semiconductor device includes a semiconductor chip, a package for housing the semiconductor chip, and wires for bonding one of a plurality of electrodes formed on the semiconductor chip and one of a plurality of electrodes formed on the package. Each of the wires has a portion rising at a steep angle with respect to one of the electrodes to be bonded and a portion descending at a gentle angle with respect to the other of the electrodes to be bonded. The rising portion and the descending portion of each wire are disposed in reverse positions with respect to the rising portion and the descending portion of the adjacent wires.

8 Claims, 5 Drawing Figures 4,618,879

SEMICONDUCTOR DEVICE HAVING ADJACENT BONDING WIRES EXTENDING AT DIFFERENT ANGLES

BACKGROUND OF THE INVENTION

1. Field of the Invention

The present invention relates to a semiconductor device, more particularly, to a wire bonding method for producing the device.

2. Description of the Prior Art

A semiconductor device comprises a ceramic package and a semiconductor chip housed within the package. Electrode pads formed on the semiconductor chip and electrode pads formed on the package are connected with wires by the wire bonding apparatus. The semiconductor chip and the vessel or package become larger, and the number of electrodes are increased. Therefore, the number of wires for bonding the electrodes of the semiconductor chip and the electrodes of the package also increases. For example, two hundred wires are required for bonding the electrodes of an LSI.

In a conventional wire bonding method, first an end of a wire is bonded to an electrode pad of the semiconductor chip by scrubbing the bonding wedge of the wire bonding apparatus. Then the wire is pulled upward and moved toward an electrode pad of the package. The wire is then obliquely moved downward onto the electrode pad of the package and bonded thereto by scrubbing the bonding wedge. The wire is but at the outside of the bonding portion so that the electrode pad of the semiconductor chip and the electrode pad of the package are bonded together by the wire.

In the conventional wire bonding method using the wire bonding apparatus (described later), the interval between two adjacent wires must be large enough to allow the vertical movement of the wire bonding apparatus at the rising portion of the wire above the electrode pad of the semiconductor chip, so as to avoid contact between the clamper behind the bonding wedge and the wires. Thus, a close arrangement of the wires cannot be achieved, which impedes the realization of a compact semiconductor device. Also, the electrode pad of the package must be large enough to avoid the abutment of the clamper of the wire bonding apparatus against the rear wall behind the electrode pad of the package. This also impedes the realization of a compact and small-sized semiconductor device.

In addition, in the above-mentioned wire bonding method, the wires are apt to accidentally come into contact with each other when the number of wires is increased, since the wires are disposed in a loop-shape above the electrode pads.

SUMMARY OF THE INVENTION

An object of the present invention is to provide a semiconductor device and a method of producing the same, in which the above-mentioned significant drawbacks are obviated.

The above-mentioned object can be achieved by a semiconductor device comprising a semiconductor chip; a package for housing the semiconductor chip; and wires for bonding one of a plurality of electrodes formed on the semiconductor chip and one of a plurality of electrodes formed on the package. Each of the wires has a portion rising at a steep angle with respect to one of the electrodes to be bonded and a portion descending at a gentle angle with respect to the other of the electrodes to be bonded. The rising portion and the descending portion of each wire are disposed in reverse positions with respect to the rising portion and the descending portion of the adjacent wires.

DESCRIPTION OF THE PREFERRED EMBODIMENTS

Embodiments of the present invention will be described hereinafter with reference to the drawings.

Figure 1:
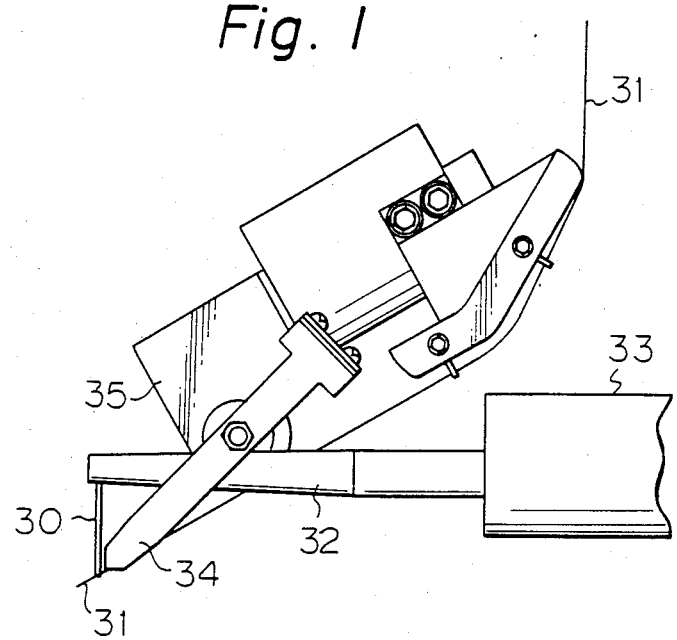
FIG. 1 is a side view of a wire bonding apparatus used in the method of the present invention.

An example of a wire bonding apparatus is illustrated in FIG. 1. A bonding wedge 30, which has a wedge-shaped tip (not shown) for pressing a wire upon an electrode pad and scrubbing the wire against the electrode pad so as to bond the wire to the electrode pad, is attached at the end of a transducer 32, which is connected to an oscillator 33 for driving the bonding wedge 30, so as to obtain the scrubbing movement of the bonding wedge 30. Numeral 31 designates a wire of aluminum or gold having a diameter of 15 to 50 μm. A pair of clampers 34 (only one of which is illustrated) is disposed behind the bonding wedge 30, astride the transducer 32, for clamping the wire 31. Numeral 35 designates a clamper drive.

Figure 2:
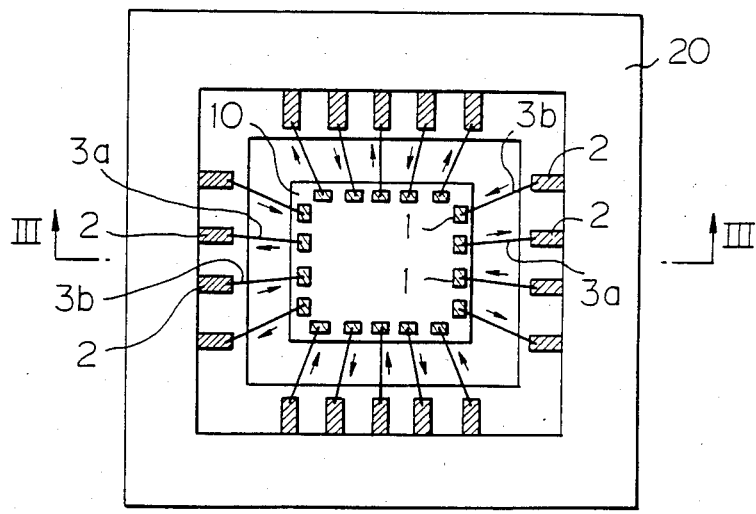
FIG. 2 is a plan view of a first embodiment of the semiconductor device of the present invention.

FIG. 2 is a plan view of an embodiment of an assembled semiconductor device in accordance with the present invention. A plurality of electrode pads 1 are formed side by side in series along four edges of a semiconductor chip 10, and a plurality of electrode pads 2 corresponding to the electrode pads 1 of the semiconductor chip 10 are formed on a ceramic package 20 around the semiconductor chip 10. Each of the electrode pads 1 of the semiconductor chip 10 is interconnected with a corresponding electrode pad 2 of the package 20 by a bonding wire 3a or 3b. In the wire bonding process, wires are bonded so that the bonding direction of each wire is the reverse of the bonding direction of the adjacent wires as illustrated by arrows in FIG. 2. The wire 3a is bonded in the normal direction from the electrode pad 1 of the semiconductor chip 10 to the electrode pad 2 of the package 20. The wire 3b is bonded in the reverse direction from the electrode pad 2 of the package 20 to the electrode pad 1 of the semiconductor chip 10.

The wire bonding apparatus can easily operate in the normal and reverse directions alternately. Thus, the wire bonding apparatus can easily interconnect the electrode pads 1 of the semiconductor chip 10 and the electrode pads 2 of the package 20 by wires 3a and 3b in the above-mentioned alternate manner.

It is possible to operate the wire bonding apparatus in such a manner that all the normal direction wires 3a are bonded first and the reverse direction wires 3b bonded afterwards, instead of operating in the normal and reverse directions alternately.

Figure 3:
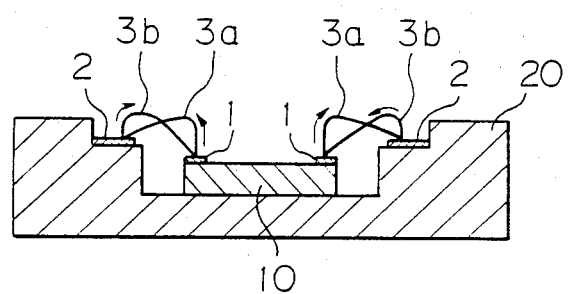
FIG. 3 is a sectional view along lines III—III of FIG. 2.

FIG. 3 is a sectional view of the semiconductor device having the above-mentioned wires 3a and 3b. Each wire rises from the electrode pad 1 or 2 to which the wire is first bonded and then descends obliquely onto the other electrode pad 1 or 2, to be connected. The two adjacent wires are kept remote from each other, so that they do not accidentally come in contact with each other, by arranging the bonding direction of the adjacent two wires to be reversed, when compared with the arrangement in which the bonding direction is the same, as shown in FIG. 3.

Figure 4:
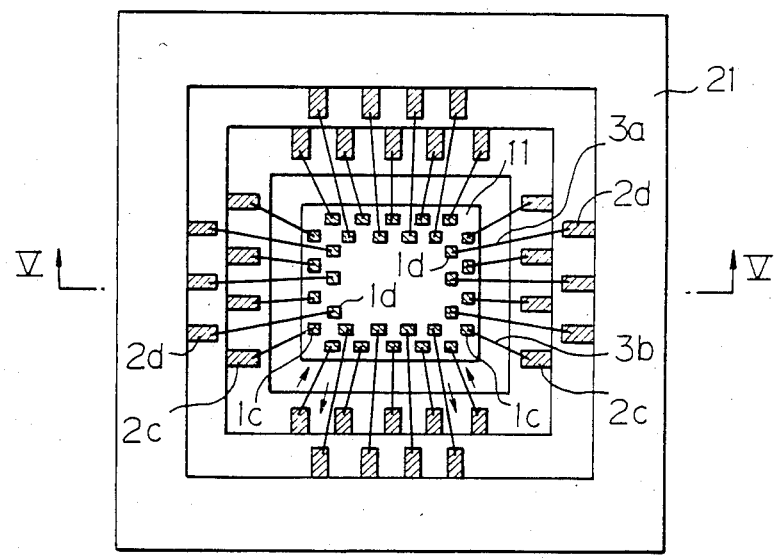
FIG. 4 is a plan view of a second embodiment of the semiconductor device of the present invention.
Figure 5:
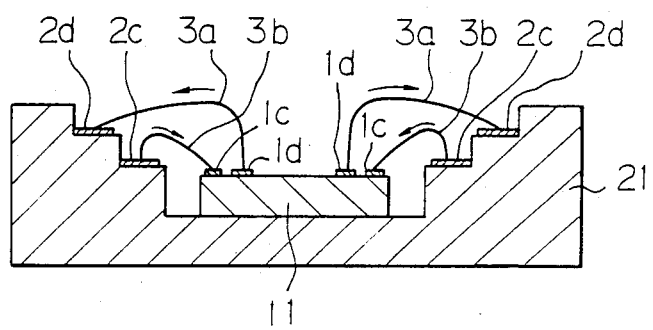
FIG. 5 is a sectional view along lines V—V of FIG. 4.

The wire bonding method for another example embodiment of the semiconductor device will be described hereinafter. In this semiconductor device, the package has two steps, i.e., upper and lower steps, around the semiconductor chip housed therein, and a plurality of electrode pads are formed on each of the upper and lower steps. The plan view of this semiconductor device is illustrated in FIG. 4 and the sectional view thereof is illustrated in FIG. 5. A plurality of electrode pads 2c are formed on the lower step of the package 21, and a plurality of electrode pads 2d are also formed on the upper step of the package 21. The electrode pads of the semiconductor chip 11 are formed in two rows, i.e., an outer row of electrode pads 1c and an inner row of electrode pads 1d, along the four edges thereof. Each of the electrode pads 2d of the upper step of the package 21 is connected to the corresponding electrode pad 1d of the inner row of pads of the semiconductor chip 11 by the normal direction bonding wire 3a. Each of the electrode pads 2c of the lower step of the package 21 is connected to the corresponding electrode pad 1c of the outer row of pads of the semiconductor chip 11 by the reverse direction bonding wire 3b. Each of the electrode pads 2d of the upper step of the package is disposed between two adjacent electrode pads 2c of the lower step of the package. Therefore, the bonding directions of the adjacent two wires are reversed, so that the two adjacent wires are remote and avoid contact with each other, as shown in FIGS. 4 and 5. The wires 3b to be bonded to the electrode pads 2d of the upper step are disposed at a higher level than the wires 3a to be bonded to the electrode pads 2c of the lower step, so that the contact between the two adjacent wires can be completely avoided. The electrode pads of the semiconductor chip may be disposed in one row, as shown in FIGS. 2 and 3, instead of two rows.

The two-row arrangement of the electrode pads of the semiconductor chip as shown in FIGS. 4 and 5 cannot be achieved in high density pads by the conventional wire bonding method, since the wire easily comes in accidental contact with the adjacent wire and the wire bonding apparatus is likely to come in contact with the wire which has already been bonded during the bonding process. The wire bonding method of the present invention makes it possible to arrange the electrode pads of the semiconductor chip in two rows and in a high density, since the possibility of contact between wires and between the wire bonding apparatus and the wires is minimized, so that the semiconductor chip becomes small and a compact semiconductor device can be obtained.

As can be seen from the embodiments of the present invention, the gap between wires can be widened without widening the gap between the electrode pads. Therefore, accidental contact between wires can be avoided and the reliability of the semiconductor device is increased. Also, a close arrangement of the electrodes can be achieved so that a compact semiconductor device can be obtained and the characteristic of the semiconductor device is upgraded. Furthermore, the adoption of the reverse bonding direction in the wire bonding process obviates the problem wherein the member behind the bonding wedge of the wire bonding apparatus abuts against the wires or rear wall of the package. Therefore, the electrode pads of the package do not require a large area for avoiding such a problem, and a compact package can be realized.

We claim:

1. A semiconductor device comprising:
   a semiconductor chip;
   a plurality of chip electrodes formed on said semiconductor chip and having electrode surfaces;
   a package for housing said semiconductor chip;
   a plurality of package electrodes formed on said package and having electrode surfaces; and
   wires for respectively bonding to said plurality of chip electrodes and said plurality of package electrodes, each of said wires having first and second ends, the angle of said first end with respect to the electrode surface of one of the chip and package electrodes to which the wire is bonded being substantially larger than the angle of said second end with respect to the electrode surface of the other of the chip and package electrodes to which the wire is bonded, said wires being disposed side-by-side so that one of said first and second ends of each wire is bonded to one of said chip electrodes, and the other of said first and second ends is bonded to one of said package electrodes, said wires being arranged so that said first ends are alternately bonded to one of said chip electrodes and one of said package electrodes.

2. A semiconductor device comprising:
   a semiconductor chip;
   a plurality of chip electrodes formed on said semiconductor chip and having electrode surfaces;
   a package for housing said semiconductor chip, said package having first and second steps formed around said semiconductor chip;
   a plurality of package electrodes having electrode surfaces formed on said package and including first package electrodes formed on said first step and second package electrodes formed on said second step; and
   wires for respectively bonding to said plurality of chip electrodes and said package electrodes, each of said wires having first and second ends, the angle of said first end with respect to the electrode surface of one of the chip and package electrodes to which the wire is bonded being substantially larger than the angle of said second end with respect to the electrode surface of the other of the chip and package electrodes to which the wire is bonded, said wires being disposed side-by-side so that one of said first and second ends of each wire is bonded to one of said chip electrodes, and the other of said first and second ends is bonded to one of said package electrodes, said wires being arranged so that said first ends are alternately bonded to one of said chip electrodes and one of said package electrodes.

3. A semiconductor device as set forth in claim 2, wherein said first package electrodes and said second package electrodes are disposed alternately, so that each of the first package electrodes formed on said first step is positioned between the adjacent two second package electrodes formed on said second step.

4. A semiconductor device as set forth in claim 3, wherein said first and second ends of said wires have first and second rising portions, respectively, and wherein the height of said first rising portion of said first end of each of the wires is different from the height of the second rising portion of said second end of the adjacent wires.

5. A semiconductor device as set forth in claim 2, wherein said plurality of chip electrodes are formed in one row along at least one edge of said semiconductor chip.

6. A semiconductor device as set forth in claim 2, wherein said plurality of chip electrodes are formed in two rows, an inner row and an outer row, along at least one edge of said semiconductor chip, and wherein the chip electrodes of the two rows are disposed alternately, so that each chip electrode of one row is positioned between each adjacent two chip electrodes of the other row.

7. A semiconductor device as set forth in claim 6, wherein said chip electrodes of said inner row of said semiconductor chip and said first package electrodes of said first step of said package are respectively bonded together, and wherein said chip electrodes of said outer row of said semiconductor chip and said second package electrodes of said second step of said package are respectively bonded together.

8. A semiconductor device comprising:
a semiconductor chip having chip electrodes formed thereon;
a package for housing said semiconductor chip, said package having package electrodes formed thereon; and
bonding wires for respectively connecting said chip electrodes to said package electrodes, each of said bonding wires having a first portion extending from one of said chip and package electrodes at a first angle with respect to the one of said chip and package electrodes, and having a second portion extending from the other of said chip and package electrodes at a second angle which is substantially less than the first angle, said bonding wires being disposed side-by-side so that one of the first and second portions of each of said bonding wires is bonded to one of said chip electrodes, and the other of the first and second portions is bonded to one of said package electrodes, said bonding wires being arranged so that the first portions are alternately bonded to one of said chip electrodes and one of said package electrodes.

* * * * *